United States Patent
Ouyang et al.

(10) Patent No.: US 9,912,349 B1
(45) Date of Patent: Mar. 6, 2018

(54) METHOD AND APPARATUS FOR PROCESSING FLOATING POINT NUMBER MATRIX, AN APPARATUS AND COMPUTER-READABLE STORAGE MEDIUM

(71) Applicant: BEIJING BAIDU NETCOM SCIENCE AND TECHNOLOGY CO., LTD., Beijing (CN)

(72) Inventors: Jian Ouyang, Beijing (CN); Ni Zhou, Beijing (CN); Yong Wang, Beijing (CN); Wei Qi, Beijing (CN)

(73) Assignee: Beijing Baidu Netcom Science And Technology Co., Ltd., Beijing (CN)

( * ) Notice: Subject to any disclaimer, the term of this patent is extended or adjusted under 35 U.S.C. 154(b) by 0 days.

(21) Appl. No.: 15/628,455

(22) Filed: Jun. 20, 2017

(30) Foreign Application Priority Data

Mar. 20, 2017 (CN) .......................... 2017 1 0165155

(51) Int. Cl.
*H03M 7/30* (2006.01)
*G06F 17/16* (2006.01)
*G06N 3/02* (2006.01)
G06F 9/30 (2018.01)
G06F 9/38 (2018.01)
G06T 15/00 (2011.01)

(52) U.S. Cl.
CPC .............. *H03M 7/30* (2013.01); *G06F 17/16* (2013.01); *G06N 3/02* (2013.01); *G06F 9/30018* (2013.01); *G06F 9/30145* (2013.01); *G06F 9/30149* (2013.01); *G06F 9/30174* (2013.01); *G06F 9/3851* (2013.01); *G06T 15/005* (2013.01)

(58) Field of Classification Search
CPC .. H03M 7/30; G06F 9/30145; G06F 9/30174; G06F 9/30149; G06F 9/3851; G06F 9/30018; G06T 15/005
USPC .......... 341/76; 712/208, 209, 210, 220, 224; 345/522
See application file for complete search history.

(56) References Cited

U.S. PATENT DOCUMENTS 7,464,252 B2 * 12/2008 Hansen ............... G06F 9/30014
712/200

* cited by examiner

*Primary Examiner* — Joseph Lauture
(74) *Attorney, Agent, or Firm* — Ladas & Parry, LLP

(57) ABSTRACT

The present disclosure provides a method and apparatus for processing a floating point number matrix, an apparatus and a computer readable storage medium. In embodiments of the present disclosure, the minimum value of the floating point number model matrix and the maximum value of the floating point number model matrix are obtained according to a floating point number model matrix to be compressed, and then, compression processing is performed for the floating point number model matrix to obtain the fixed point number model matrix according to the bit width, the minimum value of the floating point number model matrix and the maximum value of the floating point number model matrix. The compression processing is performed for the floating point number model matrix of the deep learning model by a fixed point method, to obtain the fixed point number model matrix and reduce the storage space and amount of operation of the deep learning model. Meanwhile, the present disclosure proposes a framework for implementing the apparatus in the deep learning network to maximize the deep learning network precision, that is, a multiplication portion of the matrix uses the apparatus, and operations of other portions such as activation function retain the floating point operation.

18 Claims, 3 Drawing Sheets

METHOD AND APPARATUS FOR PROCESSING FLOATING POINT NUMBER MATRIX, AN APPARATUS AND COMPUTER-READABLE STORAGE MEDIUM

The present application claims the priority of Chinese Patent Application No. 201710165155.4, filed on Mar. 20, 2017, with the title of "Method and apparatus for processing floating point number matrix, an apparatus and computer-readable storage medium", the disclosure of which is incorporated herein by reference in its entirety.

FIELD OF THE DISCLOSURE

The present disclosure relates to model-compressing technologies, and particularly to a method and apparatus for processing a floating point number matrix, an apparatus and a computer readable storage medium.

BACKGROUND OF THE DISCLOSURE

A deep learning model is applied to various applications more and more extensively, for example, speech recognition, image recognition, semantic analysis and automatic driving. According to the model, processing such as mapping and operation is performed for linear layers and non-linear layers between nodes of different layers, and during the processing, training, modification and updating are performed for the model, thereby finally enhancing classification or prediction accuracy. During actual processing, the deep learning model occupies a larger storage space and requires a large amount of operation.

There are two classes of operations in the deep learning model: one is matrix multiplication, and the other is an element-wise operation such as an activation function. The two classes of operations constitute basic units of deep learning. The matrix multiplication portion is a key module for storage and operation. To reduce the storage space and amount of operation of the deep learning model, it is desirable to provide a matrix compressing method adapted for the deep learning model. Meanwhile, to ensure the precision of the deep learning model, the element-wise operation except the matrix multiplication retains a floating point processing manner.

SUMMARY OF THE DISCLOSURE

A plurality of aspects of the present disclosure provide a method and apparatus for processing a floating point number matrix, an apparatus and a computer readable storage medium, to reduce the storage space and amount of operation of the deep learning model.

According to an aspect of the present disclosure, there is provided a method of processing a floating point number matrix, comprising:

according to a floating point number model matrix to be compressed, obtaining a minimum value of the floating point number model matrix and a maximum value of the floating point number model matrix;

according to the bit width, the minimum value of the floating point number model matrix and the maximum value of the floating point number model matrix, performing compression processing for the floating point number model matrix to obtain a fixed point number model matrix.

The above aspect and any possible implementation mode further provide an implementation mode: according to a floating point number model matrix to be compressed, obtaining a minimum value of the floating point number model matrix and a maximum value of the floating point number model matrix comprises:

performing limit solution processing for all elements of the floating point number model matrix to obtain a minimum value of the floating point number model matrix and a maximum value of the floating point number model matrix; or performing limit solution processing for each column of elements of the floating point number model matrix to obtain a minimum value of the column of element and a maximum value of the column of elements; enabling the minimum value of each column of elements of the floating point number model matrix to form a minimum value vector as the minimum value of the floating point number model matrix, and enabling the maximum value of each column of elements of the floating point number model matrix to form a maximum value vector as the maximum value of the floating point number model matrix.

The above aspect and any possible implementation mode further provide an implementation mode: according to the bit width, the minimum value of the floating point number model matrix and the maximum value of the floating point number model matrix, performing compression processing for the floating point number model matrix to obtain a fixed point number model matrix comprises:

according to the bit width, the minimum value of the floating point number model matrix and the maximum value of the floating point number model matrix, performing compression processing for the floating point number model matrix using the formula $X_{int}=2^{K}*(X-X_{Min})/(X_{Max}-X_{Min})$, to obtain the fixed point number model matrix; wherein, $X_{int}$ is an element in the fixed point number model matrix;

X is an element in the floating point number model matrix;

K is the bit width;

$X_{Min}$ is a minimum value of the floating point number model matrix; and $X_{Max}$ is a maximum value of the floating point number model matrix.

The above aspect and any possible implementation mode further provide an implementation mode: the method further comprises:

according to a floating point number input matrix to be compressed, obtaining a minimum value of the floating point number input matrix and a maximum value of the floating point number input matrix;

according to the bit width, the minimum value of the floating point number input matrix and the maximum value of the floating point number input matrix, performing compression processing for the floating point number input matrix to obtain a fixed point number input matrix.

The above aspect and any possible implementation mode further provide an implementation mode: the method further comprises:

according to the fixed point number input matrix and the fixed point number model matrix, obtaining a fixed point number output matrix from multiplication of the floating point number input matrix and floating point number model matrix;

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix.

The above aspect and any possible implementation mode further provide an implementation mode: according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix comprises:

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix using the formula $Xvec*Yvec=\alpha*\beta*Xvec_{int}*Yvec_{int}+Y_{min}*\Sigma X_{int}+X_{min}*\Sigma Y_{int}+N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha=(X_{Max}-X_{Min})/2^k$, K is the bit width, $X_{Min}$ is the minimum value of the floating point number model matrix, and $X_{Max}$ is the maximum value of the floating point number model matrix;

$\beta=(Y_{Max}-Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

According to another aspect of the present disclosure, there is provided an apparatus for processing a floating point number matrix, comprising:

a limit obtaining unit configured to, according to a floating point number model matrix to be compressed, obtain a minimum value of the floating point number model matrix and a maximum value of the floating point number model matrix;

a compressing unit configured to, according to the bit width, the minimum value of the floating point number model matrix and the maximum value of the floating point number model matrix, perform compression processing for the floating point number model matrix to obtain a fixed point number model matrix.

The above aspect and any possible implementation mode further provide an implementation mode: the limit obtaining unit is specifically configured to perform limit solution processing for all elements of the floating point number model matrix to obtain a minimum value of the floating point number model matrix and a maximum value of the floating point number model matrix; or perform limit solution processing for each column of elements of the floating point number model matrix to obtain a minimum value of the column of element and a maximum value of the column of elements; enable the minimum value of each column of elements of the floating point number model matrix to form a minimum value vector as the minimum value of the floating point number model matrix, and enable the maximum value of each column of elements of the floating point number model matrix to form a maximum value vector as the maximum value of the floating point number model matrix.

The above aspect and any possible implementation mode further provide an implementation mode: the compressing unit is specifically configured to, according to the bit width, the minimum value of the floating point number model matrix and the maximum value of the floating point number model matrix, perform compression processing for the floating point number model matrix using the formula $X_{int}=2^{K}*(X-X_{Min})/(X_{Max}-X_{Min})$, to obtain the fixed point number model matrix; wherein, $X_{int}$ is an element in the fixed point number model matrix;

X is an element in the floating point number model matrix;

K is the bit width;

$X_{Min}$ is a minimum value of the floating point number model matrix; and $X_{Max}$ is a maximum value of the floating point number model matrix.

The above aspect and any possible implementation mode further provide an implementation mode:

the limit obtaining unit is configured to, according to a floating point number input matrix to be compressed, obtain a minimum value of the floating point number input matrix and a maximum value of the floating point number input matrix;

the compressing unit is configured to, according to the bit width, the minimum value of the floating point number input matrix and the maximum value of the floating point number input matrix, perform compression processing for the floating point number input matrix to obtain a fixed point number input matrix.

The above aspect and any possible implementation mode further provide an implementation mode: the apparatus further comprises:

a computing unit configured to, according to the fixed point number input matrix and the fixed point number model matrix, obtain a fixed point number output matrix from multiplication of the floating point number input matrix and floating point number model matrix;

a decompressing unit configured to, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix to obtain a floating point number output matrix.

The above aspect and any possible implementation mode further provide an implementation mode: the decompressing unit is specifically configured to, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix using the formula $Xvec*Yvec* = \alpha*\beta*Xvec_{int}*Yvec_{int} + Y_{min}*\Sigma X_{int} + X_{min}*\Sigma Y_{int} + N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha = (X_{Max} - X_{Min})/2^k$, K is the bit width, $X_{Min}$ is the minimum value of the floating point number model matrix, and $X_{Max}$ is the maximum value of the floating point number model matrix;

$\beta = (Y_{Max} - Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

According to a further aspect of the present disclosure, there is provided an apparatus, comprising
    one or more processors;
    a memory device for storing one or more programs,
    when said one or more programs are executed by said one or more processors, said one or more processors are enabled to implement the method for processing the floating point number matrix according to the above aspect.

According to a further aspect of the present disclosure, there is provided a computer-readable storage medium in which a program is stored, the program, when executed by the processor, implementing the method for processing the floating point number matrix according to the above aspect.

In the present embodiment, the minimum value of the floating point number model matrix and the maximum value of the floating point number model matrix are obtained according to a floating point number model matrix to be compressed, and then, compression processing is performed for the floating point number model matrix to obtain the fixed point number model matrix according to the bit width, the minimum value of the floating point number model matrix and the maximum value of the floating point number model matrix. The compression processing is performed for the floating point number model matrix of the deep learning model by a fixed point method, to obtain the fixed point number model matrix and reduce the storage space and amount of operation of the deep learning model.

In addition, the technical solution according to the present invention is employed to perform independent dynamic fixed point processing for each floating point number matrix, namely, floating point number model matrix and floating point number input matrix, related to the deep learning model, to obtain a higher compression precision.

In addition, according to the technical solution of the present disclosure, since the maximum value and minimum value of the floating point number matrix, namely, floating point number model matrix and floating point number input matrix are dynamically updated along with the update of the data, it is feasible to use the bit width sufficiently, prevent occurrence of bit overflow and avoid waste of the bit width.

In addition, according to the technical solution of the present disclosure, it is unnecessary to distinguish a decimal bit from an integer bit, so it is possible to eliminate an error caused during calibration of a decimal point, and further improve the compression precision.

BRIEF DESCRIPTION OF DRAWINGS

To describe technical solutions of embodiments of the present disclosure more clearly, figures to be used in the embodiments or in depictions regarding the prior art will be described briefly. Obviously, the figures described below are only some embodiments of the present disclosure. Those having ordinary skill in the art appreciate that other figures may be obtained from these figures without making inventive efforts.

DETAILED DESCRIPTION OF PREFERRED EMBODIMENTS

To make objectives, technical solutions and advantages of embodiments of the present disclosure clearer, technical solutions of embodiment of the present disclosure will be described clearly and completely with reference to figures in embodiments of the present disclosure. Obviously, embodiments described here are partial embodiments of the present disclosure, not all embodiments. All other embodiments obtained by those having ordinary skill in the art based on the embodiments of the present disclosure, without making any inventive efforts, fall within the protection scope of the present disclosure.

It needs to be appreciated that the terminals involved in the embodiments of the present disclosure comprise but are not limited to a mobile phone, a Personal Bital Assistant (PDA), a wireless handheld device, a tablet computer, a Personal Computer (PC), an MP3 player, an MP4 player, and a wearable device (e.g., a pair of smart glasses, a smart watch, or a smart bracelet).

In addition, the term "and/or" used in the text is only an association relationship depicting associated objects and represents that three relations might exist, for example, A and/or B may represents three cases, namely, A exists individually, both A and B coexist, and B exists individually. In addition, the symbol "/" in the text generally indicates associated objects before and after the symbol are in an "or" relationship.

Figure 1:
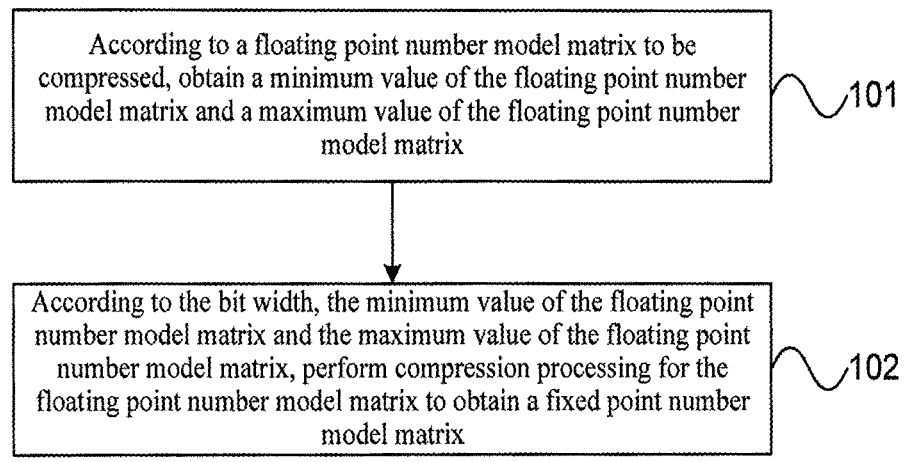
FIG. 1 is a flow chart of a method of processing a floating point number matrix according to an embodiment of the present disclosure.

FIG. 1 is a flow chart of a flow chart of a method of processing a floating point number matrix according to an embodiment of the present disclosure.

101: according to a floating point number model matrix to be compressed, obtaining a minimum value of the floating point number model matrix and a maximum value of the floating point number model matrix.

102: according to the bit width, the minimum value of the floating point number model matrix and the maximum value of the floating point number model matrix, performing compression processing for the floating point number model matrix to obtain a fixed point number model matrix.

It needs to be appreciated that subjects for executing 102-102 may partially or totally be an application located in a local terminal, or a function unit such as a plug-in or Software Development Kit (SDK) located in an application of the local terminal, or a processing engine located in a network-side server, or a distributed type system located on the network side. This is not particularly limited in the present embodiment.

It may be understood that the application may be a native application (nativeAPP) installed on the terminal, or a webpage program (webApp) of a browser on the terminal. This is not particularly limited in the present embodiment.

As such, the minimum value of the floating point number model matrix and the maximum value of the floating point number model matrix are obtained according to a floating point number model matrix to be compressed, and then, compression processing is performed for the floating point number model matrix to obtain a fixed point number model matrix according to the bit width, the minimum value of the floating point number model matrix and the maximum value of the floating point number model matrix. The compression processing is performed for the floating point number model matrix of the deep learning model by a fixed point method, to obtain the fixed point number model matrix and reduce the storage space and amount of operation of the deep learning model.

Optionally, in a possible implementation mode of the present embodiment, in 101, a limit of the floating point number model matrix may be obtained by employing many methods.

In a specific implementation procedure, a minimum value and a maximum value may be solved with respect to the floating point number model matrix. Specifically, it is feasible to perform limit solution processing for all elements of the floating point number model matrix to obtain the minimum value of the floating point number model matrix and the maximum value of the floating point number model matrix.

In another specific implementation procedure, since a basic calculating unit of the matrix multiplication is a vector dot product, it is feasible to solve a pair of limits (maximum and minimum) for each row of the floating point number input matrix, and then solve a pair of limits (maximum and minimum) for each column of the floating point number model matrix, that is, to dynamically determine a fixed point for each vector. As such, the smaller a range of values described by the fixed points is, the higher the precision is. Specifically, it is specifically feasible to perform limit solution processing for each column of elements of the floating point number model matrix to obtain a minimum value of the column of element and a maximum value of the column of elements; the minimum value of each column of elements of the floating point number model matrix forms a minimum value vector as the minimum value of the floating point number model matrix, and the maximum value of each column of elements of the floating point number model matrix forms a maximum value vector as the maximum value of the floating point number model matrix.

Usually, most of parameters of deep learning are distributed nearby 0. Therefore, in this implementation mode, the minimum value of the floating point number model matrix is considered as 0 by default for the application such as deep learning. As such, the whole calculation is simplified so much, and not too much loss is caused to the final precision.

Optionally, in a possible implementation mode of the present embodiment, in 102, it is specifically feasible to, according to the bit width, the minimum value of the floating point number model matrix and the maximum value of the floating point number model matrix, perform compression processing for the floating point number model matrix using the formula $X_{int}=2^{K}*(X-X_{Min})/(X_{Max}-X_{Min})$, to obtain the fixed point number model matrix; wherein, $X_{int}$ is an element in the fixed point number model matrix;

X is an element in the floating point number model matrix;

K is the bit width, for example, assume 16-bit fixed-point is performed, K is 16;

$X_{Min}$ is a minimum value of the floating point number model matrix; and $X_{Max}$ is a maximum value of the floating point number model matrix.

It can be seen that what is described by the fixed point number is a relative value not an absolute value obtained through static fixed point, and an original value can be obtained from $*(X_{Max}-X_{Min})/2^{k}+X_{Min}$. A range of values of the floating point number model matrix $(X_{Max}-X_{Min})$ is divided into $2^k$ portions. If the magnitude of X falls into the $j^{th}$ portion, $X_{int}=j$, $0 \leq j \leq 2^k$. This method can use the bit width most effectively. Hence, this method can use the bit width sufficiently, prevent occurrence of bit overflow and avoid waste of the bit width.

As for a floating point number input matrix, the same method may be used to perform fixed-point processing to achieve the compression. Specifically, it is feasible to, according to the floating point number input matrix to be compressed, obtain a minimum value of the floating point number input matrix and a maximum value of the floating point number input matrix, and then, according to the bit width, the minimum value of the floating point number input matrix and the maximum value of the floating point number input matrix, perform compression processing for the floating point number input matrix to obtain a fixed point number input matrix.

Similarly, it is specifically feasible to, according to the bit width, the minimum value of the floating point number input matrix and the maximum value of the floating point number input matrix using the formula $Y_{int}=2^{K}*(Y-Y_{Min})/(Y_{Max}-Y_{Min})$, perform compression processing for the floating point number input matrix to obtain a fixed point number input matrix; wherein, $Y_{int}$ is an element in the fixed point number input matrix;

Y is an element in the floating point number input matrix;

K is the bit width, for example, assume 16-bit fixed-point processing is performed, K is 16;

$Y_{Min}$ is a minimum value of the floating point number input matrix; and $Y_{Max}$ is a maximum value of the floating point number input matrix.

It can also be seen that what is described by the fixed point number is a relative value not an absolute value obtained through static fixed point processing, and an original value can be obtained from $*(Y_{Max}-Y_{Min})/2^{k}+Y_{Min}$. A range of values of the floating point number input matrix ($Y_{Max}$-$Y_{Min}$) is divided into $2^k$ portions. If the magnitude of Y falls at the $j^{th}$ portion, $Y_{int}=j$, $0 \le j < \le 2^k$. This method can use the bit width most effectively. Hence, this method can use the bit width sufficiently, prevent occurrence of bit overflow and avoid waste of the bit width.

Optionally, in a possible implementation mode of the present embodiment, after 102, the method may further comprise a step of multiplying the fixed point number input matrix and the fixed point number model matrix. Specifically, it is feasible to, according to the fixed point number input matrix and the fixed point number model matrix, obtain a fixed point number output matrix from multiplication of the floating point number input matrix and floating point number model matrix, and then, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix to obtain a floating point number output matrix.

In a specific implementation procedure, it is specifically feasible to, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix using the formula $Xvec*Yvec=\alpha*\beta*Xvec_{int}*Yvec_{int}+Y_{min}*\Sigma X_{int}+X_{min}*\Sigma Y_{int}+N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha=(X_{Max}-X_{Min})/2^k$, K is the bit width, $X_{Min}$ is the minimum value of the floating point number model matrix, and $X_{Max}$ is the maximum value of the floating point number model matrix;

$\beta=(Y_{Max}-Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

It can be seen that after the dynamic compression processing, namely, fixed-point processing, a dot product of two vectors of the original floating point number may be converted into a vector dot product of the fixed point number, and additionally some other calculations are performed. Wherein $\alpha$ and $\beta$ are constants, and may be pre-calculated duly; $\Sigma X_{int}$ and $\Sigma Y_{int}$ and $N*X_{Min}*Y_{Min}$ may also be pre-calculated duly. Upon calculation of the floating point number input matrix and the floating point number model matrix, these duly pre-calculated parameters may be re-used, so too much extra amount of calculation will not be increased.

Furthermore, in the present invention, distribution scopes of an input matrix element and a model matrix element of deep learning are symmetrical, so fixed-point processing may be performed based on a Min and a Max of absolute values of the element data, and then the corresponding Min is 0, and Max is a Max of the absolute values of element data. Since the absolute value method is employed, an individual 1 bit is needed to represent a sign bit. Therefore, (K−1) bit represents a scope of absolute values of element data. Then, During fixed-point processing, the element in the fixed point number model matrix may be simplified as $X_{int}=2^{K-1}*X/X_{Max}$;

During fixed-point processing, the element in the fixed point number input matrix may be simplified as $Y_{int}=2^{K-1}*Y/Y_{Max}$;

During a reverse fixed-point processing, the element in the floating point number output matrix may be simplified as $Xvec*Yvec=X_{Max}/2^{k-1}*Y_{Max}/2^{k-1}*Xvec_{int}*Yvec_{int}$.

As such, it is feasible to simplify the procedure of the fixed-point processing, and matrix multiplication calculation after the fixed-point processing, and not to cause too much loss to the final precision.

In the present embodiment, the minimum value of the floating point number model matrix and the maximum value of the floating point number model matrix are obtained according to a floating point number model matrix to be compressed, and then, compression processing is performed for the floating point number model matrix to obtain the fixed point number model matrix according to the bit width, the minimum value of the floating point number model matrix and the maximum value of the floating point number model matrix. The compression processing is performed for the floating point number model matrix of the deep learning model by a fixed point method, to obtain the fixed point number model matrix and reduce the storage space and amount of operation of the deep learning model.

In addition, the technical solution according to the present invention is employed to perform independent dynamic fixed point processing for each floating point number matrix, namely, floating point number model matrix and floating point number input matrix, related to the deep learning model, to obtain a higher compression precision.

In addition, according to the technical solution of the present disclosure, since the maximum value and minimum value of the floating point number matrix, namely, floating point number model matrix and floating point number input matrix are dynamically updated along with the update of the data, it is feasible to use the bit width sufficiently, prevent occurrence of bit overflow and avoid waste of the bit width.

In addition, according to the technical solution of the present disclosure, it is unnecessary to distinguish a decimal bit from an integer bit, so it is possible to eliminate an error caused during calibration of a decimal point, and further improve the compression precision.

As appreciated, for ease of description, the aforesaid method embodiments are all described as a combination of a series of actions, but those skilled in the art should appreciated that the present disclosure is not limited to the described order of actions because some steps may be performed in other orders or simultaneously according to the present disclosure. Secondly, those skilled in the art should appreciate the embodiments described in the description all belong to preferred embodiments, and the involved actions and modules are not necessarily requisite for the present disclosure.

In the above embodiments, different emphasis is placed on respective embodiments, and reference may be made to related depictions in other embodiments for portions not detailed in a certain embodiment.

Figure 2:
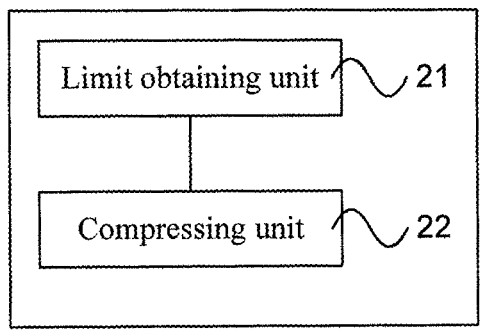
FIG. 2 is a block diagram of an apparatus for processing a floating point number matrix according to another embodiment of the present disclosure.

FIG. 2 is a block diagram of an apparatus for processing a floating point number matrix according to another embodiment of the present disclosure. The apparatus for processing a floating point number matrix of the present embodiment may comprise a limit obtaining unit 21 and a compressing unit 22, wherein the limit obtaining unit 21 is configured to, according to a floating point number model matrix to be compressed, obtain a minimum value of the floating point number model matrix and a maximum value of the floating point number model matrix; a compressing unit 22 is configured to, according to the bit width, the minimum value of the floating point number model matrix and the maximum value of the floating point number model matrix, perform compression processing for the floating point number model matrix to obtain a fixed point number model matrix.

It needs to be appreciated that part or all of the apparatus for processing the floating point number matrix according to the present embodiment may be an application located at a local terminal, namely, a terminal equipment on a designated transport vehicle, or a function unit such as a plug-in or Software Development Kit (SDK) located in an application of the local terminal, or a processing engine located in a network-side server, or a distributed type system located on the network side. This is not particularly limited in the present embodiment.

It may be understood that the application may be a native application (nativeAPP) installed on the terminal, or a webpage program (webApp) of a browser on the terminal. This is not particularly limited in the present embodiment.

Optionally, in a possible implementation mode of the present embodiment, the limit obtaining unit 21 may employ a comparator to implement hardware. The comparator consumes less resource and can easily implement the hardware. Furthermore, it is further feasible to employ a dichotomous multi-stage streaming structure, input multiple data in parallel, and satisfy a data throughput rate requirement.

Optionally, in a possible implementation mode of the present embodiment, the limit obtaining unit 21 is specifically configured to perform limit solution processing for all elements of the floating point number model matrix to obtain a minimum value of the floating point number model matrix and a maximum value of the floating point number model matrix; or perform limit solution processing for each column of elements of the floating point number model matrix to obtain a minimum value of the column of element and a maximum value of the column of elements; enable the minimum value of each column of elements of the floating point number model matrix to form a minimum value vector as the minimum value of the floating point number model matrix, and enable the maximum value of each column of elements of the floating point number model matrix to form a maximum value vector as the maximum value of the floating point number model matrix.

Optionally, in a possible implementation mode of the present embodiment, the compressing unit 22 may specifically be configured to, according to the bit width, the minimum value of the floating point number model matrix and the maximum value of the floating point number model matrix, perform compression processing for the floating point number model matrix using the formula $X_{int}=2^{K}*(X-X_{Min})/(X_{Max}-X_{Min})$, to obtain the fixed point number model matrix; wherein, $X_{int}$ is an element in the fixed point number model matrix;
X is an element in the floating point number model matrix;
K is the bit width;
$X_{Min}$ is a minimum value of the floating point number model matrix; and
$X_{Max}$ is a maximum value of the floating point number model matrix.

Correspondingly, in respect of implementation of hardware, to simplify hardware implementation, the pre-calculated $2^{K}/(X_{Max}-X_{Min})$ may be employed to convert division operation consuming resources to multiplication operation. After operation is performed in the float dimension, a float2in unit is employed to perform the fixed point processing to represent conversion. In actual hardware implementation, there might be a situation that a plurality of data are parallel. The throughput rate of data may be ensured according the number of parallel data.

Optionally, in a possible implementation mode of the present embodiment, the limit obtaining unit 21 may further be configured to, according to a floating point number input matrix to be compressed, obtain a minimum value of the floating point number input matrix and a maximum value of the floating point number input matrix;

the compressing unit 22 may further be configured to, according to the bit width, the minimum value of the floating point number input matrix and the maximum value of the floating point number input matrix, perform compression processing for the floating point number input matrix to obtain a fixed point number input matrix.

Correspondingly, in respect of implementation of hardware, to simplify hardware implementation, the pre-calculated $2^{K}/(Y_{Max}-Y_{Min})$ may be employed to convert division operation consuming resources to multiplication operation. After operation is performed in the float dimension, a float2in unit is employed to perform the fixed point processing to represent conversion. In actual hardware implementation, there might be a situation that a plurality of data are parallel. The throughput rate of data may be ensured according the number of parallel data.

Figure 3:
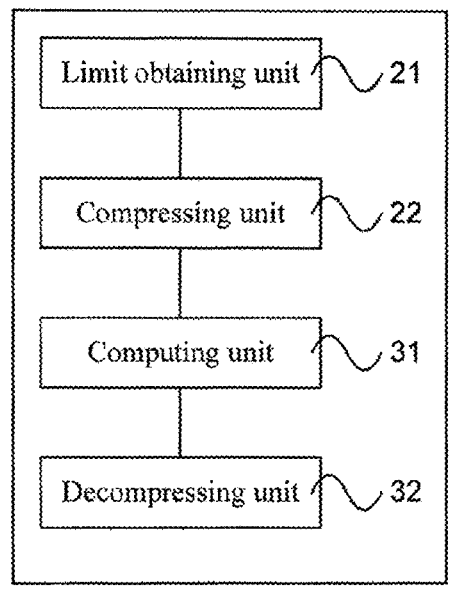
FIG. 3 is a block diagram of an apparatus for processing a floating point number matrix according to another embodiment of the present disclosure.

Optionally, in a possible implementation mode of the present embodiment, as shown in FIG. 3, the apparatus for processing a floating point number matrix according to the present embodiment may further comprise:

a computing unit 31 configured to, according to the fixed point number input matrix and the fixed point number model matrix, obtain a fixed point number output matrix from multiplication of the floating point number input matrix and floating point number model matrix;

a decompressing unit 32 configured to, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix to obtain a floating point number output matrix.

In a specific implementation procedure, the decompressing unit 32 may be specifically configured to, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, perform decompression processing for the floating point number output matrix using the formula $Xvec*Yvec = \alpha*\beta*Xvec_{int}*Yvec_{int} + Y_{min}*\Sigma X_{int} + X_{min}*\Sigma Y_{int} + N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha = (X_{Max} - X_{Min})/2^k$, K is the bit width, $X_{Min}$ is the minimum value of the floating point number model matrix, and $X_{Max}$ is the maximum value of the floating point number model matrix;

$\beta = (Y_{Max} - Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

Similarly, in respect of implementation of hardware, to simplify hardware implementation, the pre-calculated $(X_{Max} - X_{Min})/2^K$, $(Y_{Max} - Y_{Min})/2^k$, $\Sigma X_{int}$, $\Sigma Y_{int}$, and $N*X_{Min}*Y_{Min}$ may be employed. After operation is performed in the int dimension, an int2float unit is employed to perform the reverse fixed point processing to represent conversion.

During calculation of the deep learning, calculation is mostly implemented using an accelerator. It is necessary to deliver the model matrix and the input matrix, through a Direct Memory Access (DMA), from a host terminal to a deep learning accelerator terminal such as a Graphic Processing Unit (GPU), a Field-Programmable Gate Array (FPGA), an Application Specific Integrated Circuit (ASIC) or the like. Kernel calculation of the deep learning such as matrix multiplication and vector multiplication, is completed in the interior of the deep learning accelerator. This corresponds to the apparatus for processing the floating point number matrix according to the present embodiment of the present disclosure.

Figure 5:
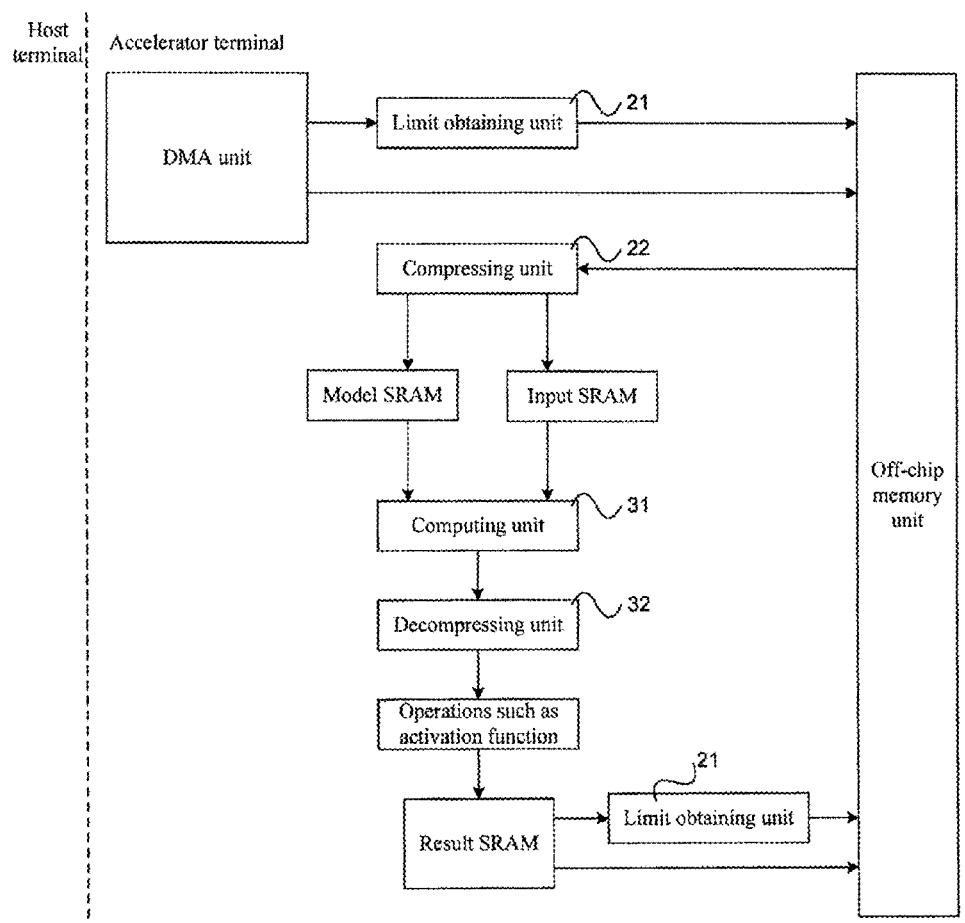
FIG. 5 is a structural schematic diagram of a deep learning model compression architecture proposed based on the apparatus according to the present disclosure.

A corresponding deep learning model compression architecture is proposed based on the apparatus according to the present disclosure, as shown in FIG. 5. At the host terminal, a limit obtaining unit for solving a Min and a Max for the data is added on a DMA unit input pathway of the deep learning accelerator terminal. This can eliminate extra data access price needed by the compression processing of the floating point number matrix. Through the delivery of the DMA unit, the model having the limit information and input data are stored in an off-chip memory unit of the accelerator terminal. This structure involves adding, on a transmission path of the Direct Memory Access (DMA), a hardware circuit employed by the limit obtaining unit 21, and obtaining the Min and Max of the input data, whereas the content of the corresponding input data remains unchanged. This procedure is completed internally by a chip of the deep learning accelerator and transparent to an upper-layer application.

After data transmission from the Host terminal to the deep learning accelerator is completed, the corresponding model and input data are obtained from the off-chip memory unit of the accelerator terminal, and the fixed point processing is performed according to the previously-obtained Min and Max first and by using the hardware circuit employed by the compressing unit 22, then, the fixed point data are respectively stored in corresponding on-chip Static Random Access Memory (SRAM), mainly, a model SRAM memory unit and an input SRAM memory unit, according to the types of the fixed point data. Then, the computing unit 31 is used to perform fixed-point computation for the model matrix having undergone the fixed-point processing and the input matrix. The fixed-point computation procedure needs to take into account amendments to the algorithm flow by the fixed-point processing scheme. Upon completion of the fixed-point computation, the hardware circuit employed by the decompressing unit 32 needs to be used to perform a reverse fixed-point operation for data of the output results, to obtain the floating point number result. Then, corresponding operations such as activation function are performed for the floating point number result, and then the floating point number result after the operation is written into a result SRAM memory unit. Finally, it is further possible to use the limit obtaining unit 21 to perform an operation of solving the Min and Max for the data in the result SRAM memory unit. In a deep neural network, output of an upper-layer model is input of a lower-layer model, and Min and Max of the upper-layer model serve as input fixed-point parameters of the lower-layer model. In the deep learning accelerator, multi-layer network computation may be performed to complete the computation of the deep learning, and results after the computation are stored in the off-chip memory unit of the deep learning accelerator, and final results are transmitted through the DMA module from the off-chip memory unit of the accelerator to the Host terminal.

As such, the amount of data of the floating point number model matrix after the fixed-point processing reduces substantially, and some models may be always stored in the on-chip SRAM memory. This can substantially reduce access to the off-chip memory during the matrix multiplication procedure, and this is particularly efficient for a situation in which there are a small number of concurrent requests for the on-chip application, and the operation of the vector multiplication matrix in algorithm such as Long Short-Term Memory (LSTM) algorithm and Recurrent Neural Network (RNN) algorithm.

It needs to be appreciated that the method in the embodiment corresponding to FIG. 1 may be implemented by the apparatus for processing the floating point number matrix according to the present embodiment. Reference may be made to relevant resources in the embodiment corresponding to FIG. 1 for detailed description, which will not be detailed any longer here.

In the present embodiment, the minimum value of the floating point number model matrix and the maximum value of the floating point number model matrix are obtained through the limit obtaining unit according to the floating point number model matrix to be compressed, and then, compression processing is performed by the compressing unit for the floating point number model matrix to obtain the fixed point number model matrix according to the bit width, the minimum value of the floating point number model matrix and the maximum value of the floating point number model matrix. The compression processing is performed for the floating point number model matrix of the deep learning model by a fixed point method, to obtain the fixed point number model matrix and reduce the storage space and amount of operation of the deep learning model.

In addition, the technical solution according to the present invention is employed to perform independent dynamic fixed point processing for each floating point number matrix, namely, floating point number model matrix and floating point number input matrix, related to the deep learning model, to obtain a higher compression precision.

In addition, according to the technical solution of the present disclosure, since the maximum value and minimum value of the floating point number matrix, namely, floating point number model matrix and floating point number input matrix are dynamically updated along with the update of the data, it is feasible to use the bit width sufficiently, prevent occurrence of bit overflow and avoid waste of the bit width.

In addition, according to the technical solution of the present disclosure, it is unnecessary to distinguish a decimal bit from an integer bit, so it is possible to eliminate an error caused during calibration of a decimal point, and further improve the compression precision.

Figure 4:
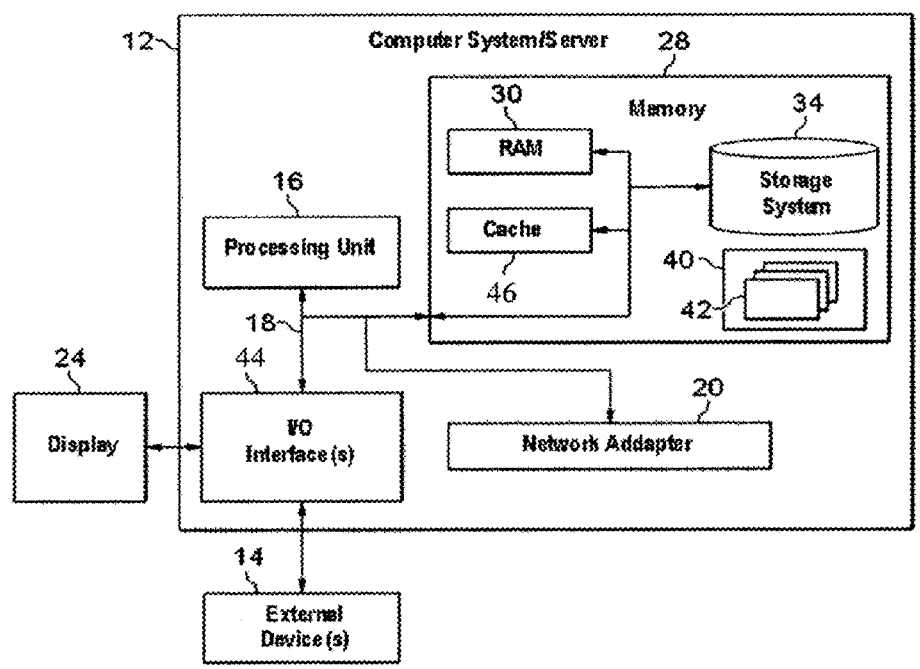
FIG. 4 is a block diagram of an exemplary computer system/server 12 adapted to implement the embodiment of the present disclosure.

FIG. 4 is a block diagram of an exemplary computer system/server 12 adapted to implement the embodiment of the present disclosure. The computer system/server 12 shown in FIG. 4 is only an example and should not bring about any limitation to the function and range of use of the embodiments of the present disclosure.

As shown in FIG. 4, the computer system/server 12 is shown in the form of a general-purpose computing device. The components of computer system/server 12 may include, but are not limited to, one or more processors or processing units 16, a storage device or system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 46. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. The memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 44. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The processing unit 16 executes various function applications and data processing by running programs stored in the system memory 28, for example, implement the method of processing the floating point number matrix provided by the embodiment corresponding to FIG. 1.

Another embodiment of the present disclosure further provides a computer-readable storage medium on which a computer program is stored. The program is executed by a processor to implement the method of processing the floating point number matrix provided by the embodiment corresponding to FIG. 1.

Specifically, any combinations of one or more computer-readable media may be employed. The machine readable medium may be a machine readable signal medium or a machine readable storage medium. A machine readable medium may include, but not limited to, an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the text herein, the computer readable storage medium can be a tangible device that can retain and store instructions for use by an instruction execution system, apparatus or device or a combination thereof.

The computer-readable signal medium may be included in a baseband or serve as a data signal propagated by part of a carrier, and it carries a computer-readable program code therein. Such propagated data signal may take many forms, including, but not limited to, electromagnetic signal, optical signal or any suitable combinations thereof. The computer-readable signal medium may further be any computer-readable medium besides the computer-readable storage medium, and the computer-readable medium may send, propagate or transmit a program for use by an instruction execution system, apparatus or device or a combination thereof.

The program codes included by the computer-readable medium may be transmitted with any suitable medium, including, but not limited to radio, electric wire, optical cable or the like, or any suitable combination thereof.

Computer program code for carrying out operations disclosed herein may be written in one or more programming languages or any combination thereof. These programming languages include an object oriented programming language such as Java, Smalltalk, C++ or the like, and conventional procedural programming languages, such as the "C" "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Those skilled in the art can clearly understand that for purpose of convenience and brevity of depictions, reference may be made to corresponding procedures in the aforesaid method embodiments for specific operation procedures of the system, apparatus and units described above, which will not be detailed any more.

In the embodiments provided by the present disclosure, it should be understood that the revealed system, apparatus and method can be implemented in other ways. For example, the above-described embodiments for the apparatus are only exemplary, e.g., the division of the units is merely logical one, and, in reality, they can be divided in other ways upon implementation. For example, a plurality of units or components may be combined or integrated into another system, or some features may be neglected or not executed. In addition, mutual coupling or direct coupling or communicative connection as displayed or discussed may be indirect coupling or communicative connection performed via some interfaces, means or units and may be electrical, mechanical or in other forms.

The units described as separate parts may be or may not be physically separated, the parts shown as units may be or may not be physical units, i.e., they can be located in one place, or distributed in a plurality of network units. One can select some or all the units to achieve the purpose of the embodiment according to the actual needs.

Further, in the embodiments of the present disclosure, functional units can be integrated in one processing unit, or they can be separate physical presences; or two or more units can be integrated in one unit. The integrated unit described above can be implemented in the form of hardware, or they can be implemented with hardware plus software functional units.

Finally, it is appreciated that the above embodiments are only used to illustrate the technical solutions of the present disclosure, not to limit the present disclosure; although the present disclosure is described in detail with reference to the above embodiments, those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present disclosure.

What is claimed is:

1. A method of processing a floating point number matrix, executed by a computer, wherein the method comprises:
    according to a floating point number model matrix to be compressed, obtaining a minimum value of the floating point number model matrix and a maximum value of the floating point number model matrix;
    according to the bit width, the minimum value of the floating point number model matrix and the maximum value of the floating point number model matrix, performing compression processing for the floating point number model matrix to obtain a fixed point number model matrix, to reduce the storage space and amount of operation.

2. The method according to claim 1, wherein, according to a floating point number model matrix to be compressed, obtaining a minimum value of the floating point number model matrix and a maximum value of the floating point number model matrix comprises:
    performing limit solution processing for all elements of the floating point number model matrix to obtain a minimum value of the floating point number model matrix and a maximum value of the floating point number model matrix; or
    performing limit solution processing for each column of elements of the floating point number model matrix to obtain a minimum value of the column of element and a maximum value of the column of elements; enabling the minimum value of each column of elements of the floating point number model matrix to form a minimum value vector as the minimum value of the floating point number model matrix, and enabling the maximum value of each column of elements of the floating point number model matrix to form a maximum value vector as the maximum value of the floating point number model matrix.

3. The method according to claim 1, wherein, according to the bit width, the minimum value of the floating point number model matrix and the maximum value of the floating point number model matrix, performing compression processing for the floating point number model matrix to obtain a fixed point number model matrix comprises:
    according to the bit width, the minimum value of the floating point number model matrix and the maximum value of the floating point number model matrix, performing compression processing for the floating point number model matrix using the formula $X_{int}=2^{K}*(X-X_{Min})/(X_{Max}-X_{Min})$, to obtain the fixed point number model matrix; wherein,
    $X_{int}$ is an element in the fixed point number model matrix;
    X is an element in the floating point number model matrix;
    K is the bit width;
    $X_{Min}$ is a minimum value of the floating point number model matrix; and
    $X_{Max}$ is a maximum value of the floating point number model matrix.

4. The method according to claim 1, wherein the method further comprises:

according to a floating point number input matrix to be compressed, obtaining a minimum value of the floating point number input matrix and a maximum value of the floating point number input matrix;

according to the bit width, the minimum value of the floating point number input matrix and the maximum value of the floating point number input matrix, performing compression processing for the floating point number input matrix to obtain a fixed point number input matrix.

5. The method according to claim 1, wherein the method further comprises:

according to the fixed point number input matrix and the fixed point number model matrix, obtaining a fixed point number output matrix from multiplication of the floating point number input matrix and the floating point number model matrix;

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix.

6. The method according to claim 5, wherein, according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix comprises:

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix using the formula $Xvec*Yvec=\alpha*\beta*Xvec_{int}*Yvec_{int}+Y_{min}*\Sigma X_{int}+X_{min}*\Sigma Y_{int}+N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha=(X_{Max}-X_{Min})/2^k$, K is the bit width, $X_{Min}$ is the minimum value of the floating point number model matrix, and $X_{Max}$ is the maximum value of the floating point number model matrix;

$\beta=(Y_{Max}-Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

7. An apparatus, wherein the apparatus comprises:

one or more processors;

a memory storing instructions, which when executed by the at least one processor, cause the at least one processor to perform operation, the operation comprising:

according to a floating point number model matrix to be compressed, obtaining a minimum value of the floating point number model matrix and a maximum value of the floating point number model matrix;

according to the bit width, the minimum value of the floating point number model matrix and the maximum value of the floating point number model matrix, performing compression processing for the floating point number model matrix to obtain a fixed point number model matrix.

8. The apparatus according to claim 7, wherein, the operation of according to a floating point number model matrix to be compressed, obtaining a minimum value of the floating point number model matrix and a maximum value of the floating point number model matrix comprises:

performing limit solution processing for all elements of the floating point number model matrix to obtain a minimum value of the floating point number model matrix and a maximum value of the floating point number model matrix; or performing limit solution processing for each column of elements of the floating point number model matrix to obtain a minimum value of the column of element and a maximum value of the column of elements; enabling the minimum value of each column of elements of the floating point number model matrix to form a minimum value vector as the minimum value of the floating point number model matrix, and enabling the maximum value of each column of elements of the floating point number model matrix to form a maximum value vector as the maximum value of the floating point number model matrix.

9. The apparatus according to claim 7, wherein, the operation of according to the bit width, the minimum value of the floating point number model matrix and the maximum value of the floating point number model matrix, performing compression processing for the floating point number model matrix to obtain a fixed point number model matrix comprises:

according to the bit width, the minimum value of the floating point number model matrix and the maximum value of the floating point number model matrix, performing compression processing for the floating point number model matrix using the formula $X_{int}=2^{K}*(X-X_{Min})/(X_{Max}-X_{Min})$ to obtain the fixed point number model matrix; wherein, $X_{int}$ is an element in the fixed point number model matrix;

X is an element in the floating point number model matrix;

K is the bit width;

$X_{Min}$ is a minimum value of the floating point number model matrix; and $X_{Max}$ is a maximum value of the floating point number model matrix.

10. The apparatus according to claim 7, wherein the operation further comprises:
   according to a floating point number input matrix to be compressed, obtaining a minimum value of the floating point number input matrix and a maximum value of the floating point number input matrix;
   according to the bit width, the minimum value of the floating point number input matrix and the maximum value of the floating point number input matrix, performing compression processing for the floating point number input matrix to obtain a fixed point number input matrix.

11. The apparatus according to claim 7, wherein the operation further comprises:
   according to the fixed point number input matrix and the fixed point number model matrix, obtaining a fixed point number output matrix from multiplication of the floating point number input matrix and the floating point number model matrix;
   according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix.

12. The apparatus according to claim 11, wherein, the operation of according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix comprises:
   according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix using the formula $Xvec*Yvec=\alpha*\beta*Xvec_{int}*Yvec_{int}+Y_{min}*\Sigma X_{int}+X_{min}*\Sigma Y_{int}+N*X_{Min}*Y_{Min}$, to obtain the floating point number output matrix; wherein,
   Xvec is a column vector of the floating point number model matrix;
   Yvec is a row vector of the floating point number input matrix;
   Xvec*Yvec is the floating point number output matrix;
   N is the number of elements in the column vector of the floating point number model matrix, or the number of elements in the row vector of the floating point number input matrix;
   $\alpha=(X_{Max}-X_{Min})/2^k$, K is the bit width, $X_{Min}$ is the minimum value of the floating point number model matrix, and $X_{Max}$ is the maximum value of the floating point number model matrix;
   $\beta=(Y_{Max}-Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;
   $Yvec_{int}$ is a row vector of the fixed point number input matrix;
   $\Sigma X_{int}$ is a sum of elements in the row vector of the fixed point number model matrix; and
   $\Sigma Y_{int}$ is a sum of elements in the column vector of the fixed point number input matrix.

13. A computer storage medium, wherein the computer storage medium is coded with a computer program, and when the program is executed by one or more computers, the one or more computers perform the following operation:
   according to a floating point number model matrix to be compressed, obtaining a minimum value of the floating point number model matrix and a maximum value of the floating point number model matrix;
   according to the bit width, the minimum value of the floating point number model matrix and the maximum value of the floating point number model matrix, performing compression processing for the floating point number model matrix to obtain a fixed point number model matrix.

14. The computer storage medium according to claim 13, wherein, the operation of according to a floating point number model matrix to be compressed, obtaining a minimum value of the floating point number model matrix and a maximum value of the floating point number model matrix comprises:
   performing limit solution processing for all elements of the floating point number model matrix to obtain a minimum value of the floating point number model matrix and a maximum value of the floating point number model matrix; or
   performing limit solution processing for each column of elements of the floating point number model matrix to obtain a minimum value of the column of element and a maximum value of the column of elements; enabling the minimum value of each column of elements of the floating point number model matrix to form a minimum value vector as the minimum value of the floating point number model matrix, and enabling the maximum value of each column of elements of the floating point number model matrix to form a maximum value vector as the maximum value of the floating point number model matrix.

15. The computer storage medium according to claim 13, wherein, the operation of according to the bit width, the minimum value of the floating point number model matrix and the maximum value of the floating point number model matrix, performing compression processing for the floating point number model matrix to obtain a fixed point number model matrix comprises:
   according to the bit width, the minimum value of the floating point number model matrix and the maximum value of the floating point number model matrix, performing compression processing for the floating point number model matrix using the formula $X_{int}=2^K*(X-X_{Min})/(X_{Max}-X_{Min})$, to obtain the fixed point number model matrix; wherein,
   $X_{int}$ is an element in the fixed point number model matrix;
   X is an element in the floating point number model matrix;
   K is the bit width;
   $X_{Min}$ is a minimum value of the floating point number model matrix; and
   $X_{Max}$ is a maximum value of the floating point number model matrix.

16. The computer storage medium according to claim 13, wherein the operation further comprises:

according to a floating point number input matrix to be compressed, obtaining a minimum value of the floating point number input matrix and a maximum value of the floating point number input matrix;

according to the bit width, the minimum value of the floating point number input matrix and the maximum value of the floating point number input matrix, performing compression processing for the floating point number input matrix to obtain a fixed point number input matrix.

17. The computer storage medium according to claim 13, wherein the operation further comprises:

according to the fixed point number input matrix and the fixed point number model matrix, obtaining a fixed point number output matrix from multiplication of the floating point number input matrix and the floating point number model matrix;

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix.

18. The computer storage medium according to claim 17, wherein, the operation of according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix to obtain a floating point number output matrix comprises:

according to the fixed point number input matrix, the minimum value of the floating point number input matrix and the maximum value of the floating point number input matrix, and the fixed point number model matrix, the minimum value of the floating point number model matrix and the maximum value of the floating point number model matrix, performing decompression processing for the floating point number output matrix using the formula $Xvec*Yvec=\alpha*\beta*Xvec_{int}*Yvec_{int}+Y_{min}*\Sigma X_{int}+X_{min}*\Sigma Y_{int}+N*X_{Min}*Y_{Min}$, to obtain the floating point number output matrix; wherein, Xvec is a column vector of the floating point number model matrix;

Yvec is a row vector of the floating point number input matrix;

Xvec*Yvec is the floating point number output matrix;

N is the number of elements in the column vector of the floating point number model matrix, or the number of elements in the row vector of the floating point number input matrix;

$\alpha=(X_{Max}-X_{Min})/2^k$, K is the bit width, $X_{Min}$ is the minimum value of the floating point number model matrix, and $X_{Max}$ is the maximum value of the floating point number model matrix;

$\beta=(Y_{Max}-Y_{Min})/2^k$, $Y_{Min}$ is the minimum value of the floating point number input matrix, and $Y_{Max}$ is the maximum value of the floating point number input matrix;

$Xvec_{int}$ is a column vector of the fixed point number model matrix;

$Yvec_{int}$ is a row vector of the fixed point number input matrix;

$\Sigma X_{int}$ is a sum of elements in the row vector of the fixed point number model matrix; and $\Sigma Y_{int}$ is a sum of elements in the column vector of the fixed point number input matrix.

\* \* \* \* \*